United States Patent

Otani et al.

Patent Number: 5,593,722
Date of Patent: Jan. 14, 1997

[54] METHOD OF PRODUCING THICK MULTI-LAYER SUBSTRATES

[75] Inventors: Yuji Otani, Okazaki; Takashi Nagasaka, Anjo; Mitsuhiro Saitou, Oobu, all of Japan

[73] Assignee: Nippondenso Co., Ltd., Kariya, Japan

[21] Appl. No.: 599,112

[22] Filed: Feb. 9, 1996

Related U.S. Application Data

[63] Continuation of Ser. No. 170,926, Dec. 21, 1993, abandoned.

[30] Foreign Application Priority Data

Dec. 22, 1992 [JP] Japan .................. 4-342802
Dec. 22, 1992 [JP] Japan .................. 4-342803

[51] Int. Cl.$^6$ ........................................ B05D 5/12
[52] U.S. Cl. .................. 427/101; 427/103; 427/376.2; 427/383.5; 427/397.7; 427/404; 427/419.2; 427/419.3; 427/419.4; 427/554; 427/555
[58] Field of Search .................. 427/101, 103, 427/376.2, 383.5, 397.7, 554, 555, 404, 419.2, 419.3, 419.4

[56] References Cited

U.S. PATENT DOCUMENTS 4,146,673  3/1979  Headley .................. 427/101
4,464,421  8/1984  Howell .................. 427/376.2
4,632,845  12/1986 Obstfelder .................. 427/101
4,796,356  1/1989  Ozaki .................. 427/101
4,830,878  5/1989  Kaneko et al. .................. 427/96
5,116,641  5/1992  Patel .................. 427/555

FOREIGN PATENT DOCUMENTS 61-65464   4/1986  Japan .
61-065465  4/1986  Japan .
02265297   10/1990 Japan .

Primary Examiner—Shrive Beck
Assistant Examiner—David M. Maiorana
Attorney, Agent, or Firm—Cushman, Darby & Cushman IP Group of Pillsbury Madison & Sutro LLP

[57] ABSTRACT

A method is provided for easily producing thick multi-layer substrates maintaining highly accurate resistances with little variation. A thick-film resistor 6 on a ceramic substrate 1 is fired at a temperature higher than the temperature of firing a glass insulating layer 2 that is formed thereon in contact therewith. This makes it possible to decrease the change in the resistance in a subsequent high-temperature step of firing the glass insulating layers 2 to 4. Moreover, after the glass insulating layer 2 is formed on the thick-film resistor 6 on the ceramic substrate 1, laser trimming is effected through a window or the glass insulating layer 2 and, thereafter, the glass insulating layers 3 and 4 are formed. This makes it possible to decrease the change in the resistance of the thick-film resistor 6 after laser trimming and to reduce the laser output.

22 Claims, 7 Drawing Sheets

METHOD OF PRODUCING THICK MULTI-LAYER SUBSTRATES

This is a continuation of application No. 08/170,926, filed on Dec. 21, 1993 which was abandoned upon the filing hereof.

BACKGROUND OF THE INVENTION

1. Field of the Invention

The present invention relates to a method of producing thick multi-layer substrates.

2. Description of the Related Art

According to a conventional method of producing thick multi-layer substrates by printing a plurality of insulating layers on a ceramic substrate followed by firing and, then, printing a wiring pattern on the insulating layers followed by firing, it is a customary practice to fire the plurality of insulating layers and the wiring pattern all at the same temperature.

When it is attempted to produce the thick multi-layer substrate by printing a thick-film resistor on a ceramic substrate followed by firing, printing a plurality of insulating layers successively on the ceramic substrate followed by firing and printing a wiring pattern on the insulating layers followed by firing according to the above-mentioned prior art, therefore, it can be contrived to fire the thick-film resistor, the plurality of insulating films and the wiring pattern all at the same temperature.

According to the above-mentioned production method in which the temperature of firing thick-film resistor is the same as the temperature of firing the insulating layers and the wiring patterns, however, mutual diffusion and thermal stress take place between the thick-film resistor and the neighboring insulating layers due to the thermal effect in the step of firing after the thick-film resistor has been fired, resulting in a great change in the resistance of the thick-film resistor.

The above-mentioned problem can be overcome by forming an opening in all of the insulating layers, and subjecting the thick-film resistor to the laser trimming after all of the insulating layers have been fired in order to adjust the resistance as disclosed in Japanese Unexamined Patent Publication (Kokai) No. 61-65464. Forming an opening in the insulating layers, however, produces dead space in which no wiring can be laid, creating another problem of an increase in substrate area.

Further, in the conventional process, another problems arises, in which, when a number of thick-film resistors are to be formed by the laser trimming, therefore, designing of the wiring pattern becomes complex and the wiring becomes too long. Moreover, the thick-film resistor is exposed in the window, causing the device to lose stability against the external environment.

Therefore, the following method can be considered; the resistance is adjusted through the whole glass insulating layers after the whole glass insulating layers have been fired. However, still problem arises in which the laser trimming is effected through the whole thick glass insulating layers, there take place absorption, scattering and reflection on the glass insulating layers and on the interfaces thereof. Therefore, the laser output must be increased to trim the thick-film resistor. However, an increase in the laser output results in an increased thermal effect to the peripheral portions that may adversely affect the peripheral wirings and circuit elements such as giving thermal stress and the like.

SUMMARY OF THE INVENTION

The present invention was accomplished in view of the above-mentioned problems, and its object is to provide a method of producing thick multi-layer substrates which allow the resistances of thick-film resistors to be precisely determined with ease without increasing the surface areas of the substrates.

Therefore, the inventors of this application had carried out an experiment on this problem and observed the results obtained by the experiment with respect to how the resistance is changed by the firing process. The results are indicated in FIG. 6. FIG. 6 illustrates changes in the resistances at each of the steps when three thick-film resistors of different shapes are independently formed on the same substrate and when a plurality of insulating layers are laminated thereon.

In FIG. 6, the ordinate represents the degree of change of when the resistances of the thick-film resistors at the initial stage are set to be a reference value of 1. Along the abscissa are plotted the steps, from the left toward the right, of producing a thick multi-layer substrate.

As is obvious from FIG. 6, the resistance of the thick-film resistor becomes very different from what was under the nonfired condition after the first glass insulating layer is fired through the first step irrespective of the shape of the thick-film resistor, and the resistance of the thick multi-layer substrate is largely determined through the first step. From this result, it can be understood that the resistance value is greatly changed after the firing process is carried out for the first layer, in accordance with the configuration of the layer, however it will become small in the successive firing processes, respectively.

The above-mentioned objects of the present invention can be accomplished by the method of producing thick multi-layer substrates having a basic technical constitution that is described below.

That is, according to a first embodiment of the present invention, a method of producing thick multi-layer substrates comprises a step of forming a thick-film resistor by printing a thick-film resistor on a ceramic substrate followed by firing, a step of forming insulating layers by successively printing a plurality of insulating layers on the surfaces of said thick-film resistor and on said ceramic substrate followed by firing, and a step of forming wiring by printing a wiring pattern onto said insulating layers followed by firing, and wherein said thick-film resistor is fired at a temperature higher than a temperature of firing said insulating layers that are in contact with said thick-film resistor.

According to a second embodiment, furthermore, a method of producing thick multi-layer substrates comprises a step of forming a thick-film resistor by printing a thick-film resistor on a ceramic substrate followed by firing, a step of forming insulating layers by successively printing a plurality of insulating layers on the surfaces of said thick-film resistor and on said ceramic substrate followed by firing, a step of forming wiring by printing a wiring pattern onto said insulating layers followed by firing, and a step of trimming said thick-layer resistor with a laser which is one of the resistance-adjusting means, wherein said step of trimming with a laser beam is effected after the firing of part of said plurality of insulating layers on said thick-film resistor but before the firing of the remaining layers.

That is, according to the first embodiment of the present invention, a thick-film resistor is obtained having a stable and highly precise resistance by adjusting the firing temperature for forming the insulating layers without relying upon the resistance adjusting operation such as the trimming with a laser beam to stabilize the resistance of the thick-film resistor.

According to the method of producing thick multi-layer substrates of the present invention if described more concretely, the thick-film resistor and part of the insulating layers on the ceramic substrate are fired at a temperature higher than a temperature of firing the insulating layers that are laminated thereon in contact therewith.

This makes it possible to precisely determine the resistance without the need of effecting the laser trimming by which a recessed portion is formed in the insulating layers.

That is, a change in the resistance after the thick-film resistor is fired is caused by the thermal stress and mutual diffusion between the thick-film resistor and the insulating layers in contact thereto in the subsequent high-temperature steps including firing of insulating layers and of wirings (circuit patterns and via- hole conductors).

According to experiments conducted by the present inventors, however, it was found that once the thick-film resistor and part of the insulating layers are fired, a further change in the resistance can be suppressed in the subsequent high-temperature steps of firing insulating layers and wiring patterns.

It is presumed that the firing of the thick-film resistor and part of the insulating layers at a high temperature helps increase the force of bonding glass particles and electrically conducting particles that constitute the thick-layer resistor and further helps increase the density, and whereby the solid-phase diffusion is suppressed between the thick-film resistor and the insulating layer in contact thereto in the subsequent step of firing the insulating layers at a lower temperature.

That is, with the thick-film resistor and part of the insulating layers being fired at a high temperature, the resistance remains stable and varies little even when the insulating layers are then fired. Accordingly, there is no need of providing windows in the insulating layers and the surface area of the substrate can be decreased.

According to the above-mentioned first embodiment of the present invention, the thick-film resistor is fired at a temperature higher than a temperature of firing the insulating layers and the wiring pattern in the case when no error at all is permitted in the resistance of the thick-film resistor, and the firing at a high temperature is effected to the upper insulating layers as the allowance of the resistance error increases.

Next, in the method of producing thick multi-layer substrates according to the second embodiment of the present invention, the resistance-adjusting operation such as the laser trimming or the like is positively carried out in order to adjust the resistance of the thick-film resistor in addition to that of the above-mentioned first embodiment.

That is, in the method of producing thick multi-layer substrates according to the second embodiment of the present invention, part of the insulating layers is formed on the thick-film resistor on the ceramic substrate, the laser trimming is effected through the window or through the insulating layers and, then, the remaining insulating layers are formed to offer the following effects.

A change in the resistance of the thick-film resistor is decreased after the laser trimming. As described above, it was found that a change in the resistance in the step of firing the first insulating layer (lowermost layer on the thick-film resistor) occupies a majority portion of the change among the high-temperature steps as shown in FIG. 6. Therefore, if the laser trimming is effected after the lowermost insulating layer on the thick-film resistor is fired, a further change in the resistance of the thick-film resistor is greatly decreased in the subsequent high-temperature steps.

According to the second embodiment of the present invention, the laser trimming need not be effected through all of the insulating layers, and the laser output can be suppressed. When the laser trimming is effected through the lowermost insulating layer on the thick-film resistor, in particular, the laser output hardly needs to be increased at all. Furthermore, an increase in the laser output can be avoided when the laser trimming is effected by providing a window in the lowermost insulating layer or in part of the insulating layers including the lowermost insulating layer in the region of the thick-film resistor that is to be subjected to the laser trimming.

According to the present invention, no window is formed in the remaining insulating layers that includes at least the uppermost layer on the thick-film resistor. It is therefore allowed to lay the wiring pattern thereon. Moreover, the thick-film resistor can be protected from the external environment (e.g., humidity).

DETAILED DESCRIPTION OF THE PREFERRED EMBODIMENTS

Examples of the method of producing thick multi-layer substrates according to first and second embodiments of the present invention will now be described in detail with reference to the drawings.

First, examples of the method of producing thick multi-layer substrates according to the first embodiment of the present invention will be described.

That is, according to the first embodiment of the present invention as described earlier, the basic technical idea resides in a method of producing thick multi-layer substrates comprising a step of forming a thick-film resistor by printing a thick-film resistor on a ceramic substrate followed by firing, a step of forming insulating layers by successively printing a plurality of insulating layers on the surfaces of said thick-film resistor and on said ceramic substrate followed by firing, and a step of forming a wiring by printing a wiring pattern onto said insulating layers followed by firing, wherein said thick-film resistor is fired at a temperature higher than a temperature of firing said insulating layers that are in contact with said thick-film resistor.

According to the first embodiment of the present invention, furthermore, the condition is not necessarily limited to the one in which the thick-film resistor is fired at a temperature higher than a temperature of firing the insulating layer that is in contact with the thick-film resistor but includes ones in which the thick-film resistor is fired at a temperature higher than a temperature of firing a plurality of insulating layers that are covering the thick-film resistor and of firing the wiring pattern, or includes the ones that are common to the above-mentioned conditions but in which at least part of the plurality of insulating layers is fired at a temperature different from a temperature at which other insulating layers are fired.

The conditions may further include ones which encompass the above-mentioned conditions but in which the insulating layer close to the thick-film resistor is fired at a temperature higher than a temperature of firing the insulating layers that are located remote from the thick-film resistor.

Figure 7:
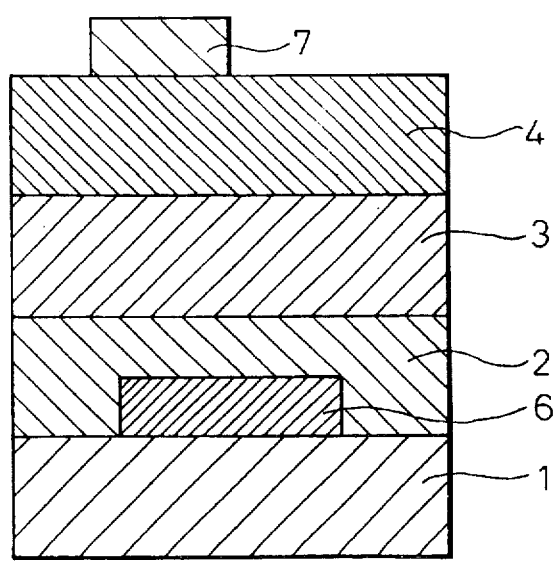
FIG. 7 is a diagram explaining a firing method according to a first embodiment of the present invention.

If the above-mentioned technical constitution is described with reference to FIG. 7, a thick-film resistor 6 is fired at a temperature higher than a temperature of firing a plurality of insulating layers 2 to 4 and a wiring pattern 7. Or, among the plurality of insulating layers 2 to 4, the insulating layer 2 which is directly covering the thick-film resistor is fired, or up to a predetermined number of insulating layers 3, 4, . . . from the insulating layer 2 and the wiring pattern are fired at a temperature higher than a temperature of firing the subsequently formed insulating layers and the wiring patterns. That is, in FIG. 7, the insulating layer 2 is fired at a temperature higher than a temperature of firing the insulating layers 3, 4 and the wiring pattern 7. Or, the insulating layers 2 and 3 are fired at a temperature higher than a temperature of firing the insulating layer 4 and the wiring pattern 7.

According to the first embodiment of the present invention, the thick-film resistor is preferably fired at a temperature which is higher by 20° to 100° C. than a temperature of firing the insulating layers.

When the temperature difference is smaller than 20° C., the resistance varies greatly and when the temperature difference exceeds 100° C., the wiring conductor (usually silver-type conductor, e.g., Ag, AgPd, AgPt) in contact therewith melts or solid-phase diffusion takes place relative to the wiring conductor.

EXAMPLE 1

The structure of a thick multi-layer substrate obtained according to the method of the present invention will now be described with reference to FIG. 1.

Figure 1:
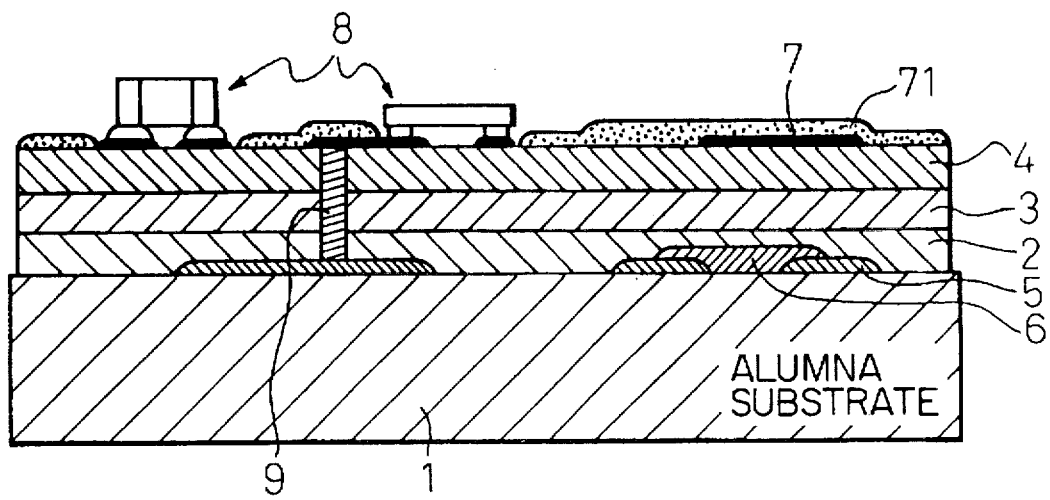
FIG. 1 is a sectional view which schematically illustrates a thick multi-layer substrate according to Example 1.

FIG. 1 illustrates a thick multi-layer substrate having three glass insulating layers 2 to 4 formed on an alumina substrate 1.

A wiring 5 and a thick-film resistor 6 are printed and fired on the substrate 1, the glass insulating layers 2 to 4 are formed thereon, and a wiring 7 and a protecting glass 71 are formed on the glass insulating layer 4. Circuit parts 8 are soldered on the glass insulating layer 4. Reference numeral 9 denotes a conductor filled in a via hole.

The method of producing the thick-film multi-layer substrate according to the first embodiment will now be described as Example 1.

(Step for forming thick-film resistor)

Figure 2:
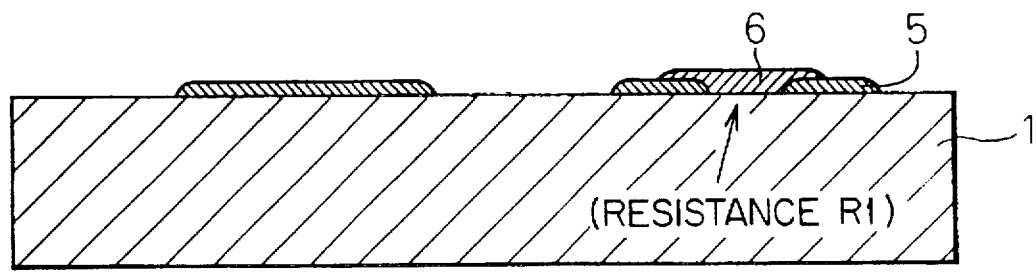
FIG. 2 is a sectional view which schematically illustrates a step of production according to Example 1.

As shown in FIG. 2, first, an Ag powder is kneaded with ethyl cellulose as a binder and terpineol as a solvent to prepare an electrically conducting paste. The electrically conducting paste is then printed onto the alumina substrate 1 that has been fired at about 1,600° C. and is fired in the air according to a firing profile of a temperature of 800° to 950° C. for 10 minutes to form a wiring 5.

Next, a mixture powder is obtained by mixing an $RuO_2$ powder in a predetermined vol % into 50 to 80 vol % of a glass powder having an average grain size of 2 to 5 μm consisting of a mixture of PbO, $Al_2O_3$, $SiO_2$, $B_2O_3$ at a predetermined mixing ratio that has been pulverized after having been melted at 1,200° to 1,500° C. and having been quickly quenched in the water. The mixture powder is then kneaded with a solvent (e.g., terpineol) and a binder (e.g., ethyl cellulose) to prepare a resistor paste which is then printed maintaining a thickness of 7 to 15 μm on the surface of the alumina substrate 1 and is fired in the air according to a firing profile of a temperature of 820° to 1,050° C. for 10 minutes to form a thick-film resistor 6.

(Step of forming the lowermost glass insulating layer on the thick-film resistor)

Figure 3:
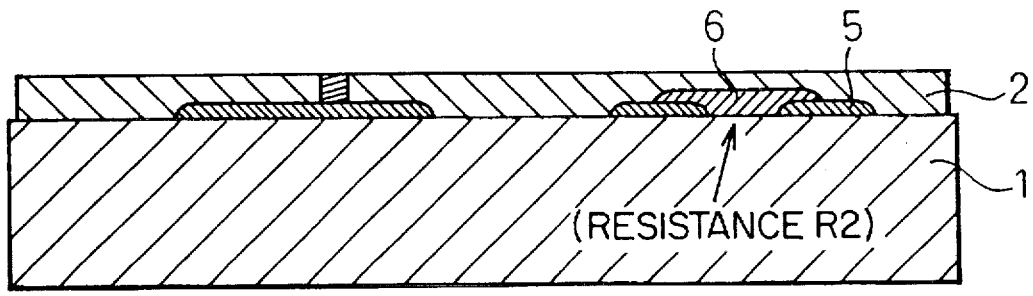
FIG. 3 is a sectional view which schematically illustrates a step of production according to Example 1.

Referring next to FIG. 3, a glass paste is prepared by kneading a mixture obtained by adding predetermined amounts of a solvent (e.g., terpineol) and a binder (e.g., ethyl cellulose) to a glass powder having an average grain size of 2 to 5 μm consisting of a mixture of CaO, $Al_2O_3$, $SiO_2$, ZiO, PbO and the like at a predetermined mixing ratio that has been pulverized after having been melted at 1,200° to 1,500° C. and having been quickly quenched in the water. This glass paste is printed maintaining a thickness of 15 to 25 μm on the alumina substrate 1 and is fired according to a firing profile of a temperature of 800° to 950° C., which is lower than the temperature of firing the thick-film resistor 6 for 10 minutes, to form a glass insulating layer 2.

(Step of forming remaining glass insulating layers and internal wiring)

Figure 4:
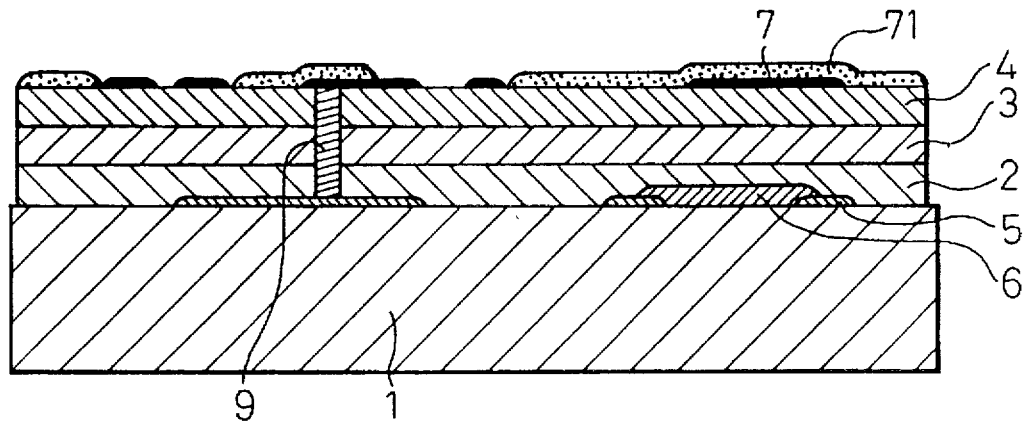
FIG. 4 is a sectional view which schematically illustrates a step of production according to Example 1.

Referring next to FIG. 4, a glass insulating layer 3 is formed through the same step as the step of forming the above-mentioned glass insulating layer 2 and, then, a via hole penetrating through the glass insulating layers 2 and 3 is filled with the above-mentioned electrically conducting paste by screen-printing, followed by the firing in the air according to a firing profile of a temperature of 800° to 950°

C., which is lower than the temperature of firing the thick-film resistor 6 for 10 minutes, in order to form the lower part of the hole-filled conductor 9.

Then, a glass insulating layer 4 is formed through the same step as the step of forming the glass insulating layer 2 and, then, a via hole in the glass insulating layer 4 communicated with the above via hole is filled with an Ag paste by the screen-printing, followed by the firing in the air according to a firing profile of a temperature of 800 to 950 for 10 minutes to form an upper part of the hole-filled conductor 9.

(Step of forming circuit on the surface layer)

As shown in FIG. 4, next, the electrically conducting paste is printed on the surface of the glass insulating layer 4 and is fired according to a firing profile of a temperature of 800° to 950° C., which is lower than the temperature of firing the thick-film resistor 6 for 10 minutes, to form a wiring 7. On the wiring 7 is then printed a protective glass paste which is then fired in the air according to a firing profile of a peak temperature of 500° to 650° C. to form a protective glass layer 71.

The protective glass paste is prepared by kneading a mixture which is obtained by adding predetermined amounts of a solvent (e.g., terpineol) and a binder (e.g., ethyl cellulose) to a glass powder having an average grain size of 2 to 5 μm consisting of a mixture of PbO, $SiO_2$, $B_2O_3$ at a predetermined mixing ratio that has been melted at 1,200° to 1,500° C. and has been quickly quenched in water.

(Step of mounting circuit parts)

Referring next to FIG. 1, circuit parts 8 are soldered onto the surface of the glass insulating layer 4 to finish the steps.

In the process of forming the substrate, furthermore, it is allowable to use a powder mixture of Ag and Pd or Ag and Pt as the electrically conducting paste instead of using the Ag powder. It is also allowable to use Cu. In this case, however, the firing must be carried out in an $N_2$ atmosphere in order to prevent oxidation.

In the step of forming circuit on the surface, furthermore, resistors may be formed among the wirings that have been formed by using electrically conducting paste.

Figure 5:
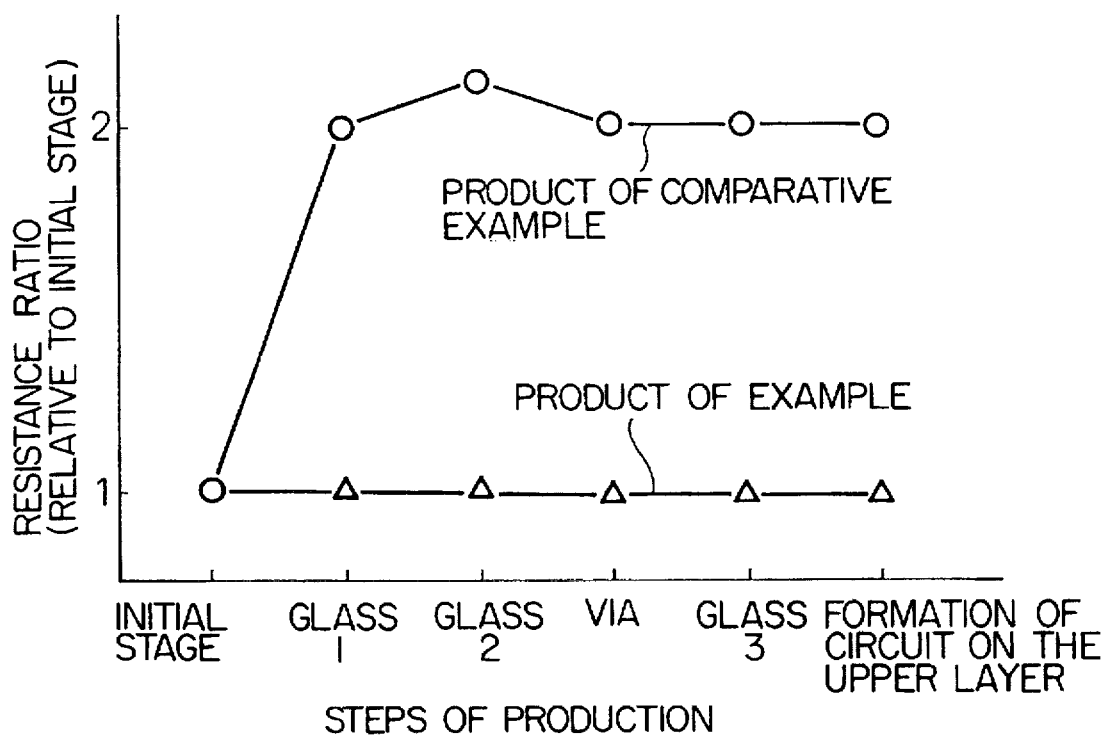
FIG. 5 is a diagram illustrating changes in the resistance of the thick-film resistor after each of the steps of Example 1.
Figure 6:
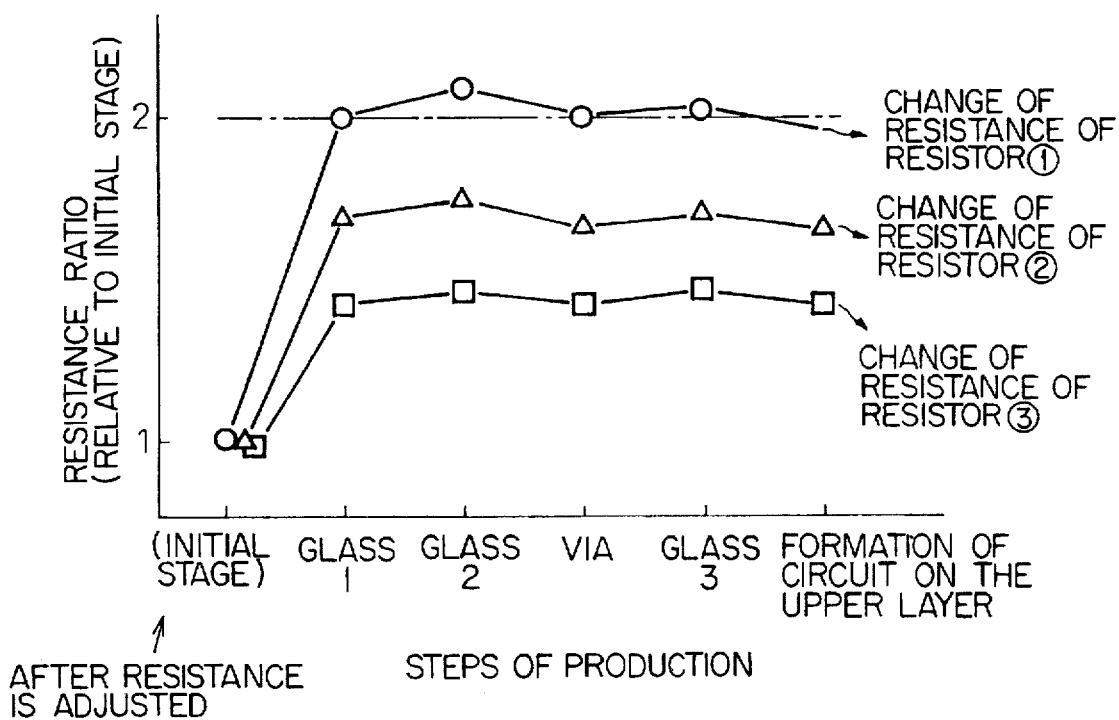
FIG. 6 is a diagram illustrating changes after each of the steps of the resistances of the three resistors formed on a thick-film multi-layer substrate.

FIG. 5 shows monitored results of changes in the resistance of the thick-film resistor 6 after each of the production steps. As a Comparative Example, there are also shown changes in the resistance of the thick-film resistor of the substrate that was prepared in the same method as that of this Example with the exception of firing the thick-film resistor 6 according to a firing profile of a temperature of 850° C. for 10 minutes. As will be understood from FIG. 5, the resistance of the thick-film resistor 6 according to this Example fired at a high temperature changes very little as compared with that of the Comparative Example.

EXAMPLE 2

According to the basic technical idea of the method of producing a thick-film resistor substrate of the first embodiment of the present invention, the thick-film resistor is obtained with great precision and stability even without effecting the operation for adjusting the resistance such as laser trimming technology. A more preferable thick-film resistor, however, can be obtained if the operation is carried out for adjusting the resistance. Therefore, described below as Example 2 is the case where a step of adjusting the resistance such as laser trimming is added to the aforementioned Example 1 (this Example is encompassed by the second embodiment mentioned earlier).

This Example 2 employs the same steps and the same conditions as those of Example 1. Here, however, the temperature of firing the thick film in the step of forming thick-film resistor of Example 1 is set to be 800° to 950° C. In Example 2, furthermore, a step of adjusting the resistance is inserted between the step of forming the thick-film resistor and the step of forming the remaining glass insulating layers and internal wiring of Example 1. Moreover, the step of adjusting the resistance is based upon the laser trimming method.

Therefore, described below is only the step of laser trimming that is different from the constitution of the above-mentioned Example 1.

That is, the step of laser trimming is provided after the step of forming the thick-film resistor of Example 1.

(Step of laser trimming)

Figure 9:
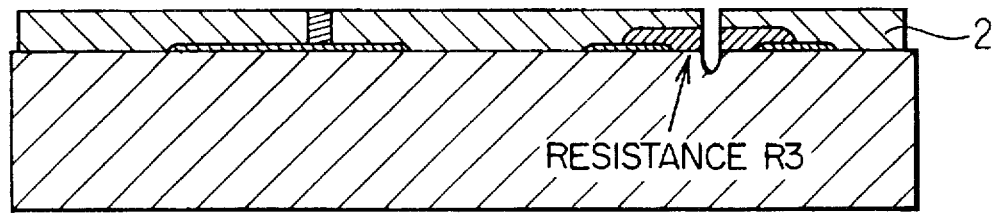
FIG. 9 is a sectional view which schematically illustrates a step of production according to Example 2.

Referring next to FIG. 9, the thick-film resistor 6 is irradiated with a laser beam through the glass insulating layer 2 while monitoring the resistance of the thick-film resistor 6 in order to trim the thick-film resistor.

(Step of forming remaining glass insulating layers and internal wiring)

Figure 10:
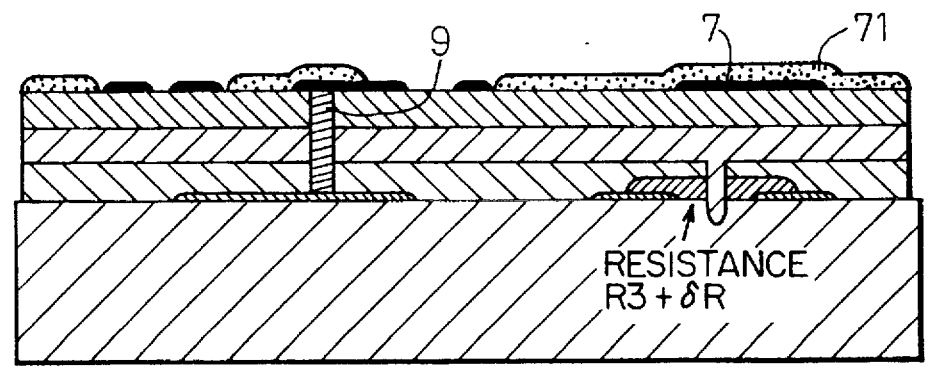
FIG. 10 is a sectional view which schematically illustrates a step of production according to Example 2.

Referring next to FIG. 10, a glass insulating layer 3 is formed through the same step as the above-mentioned step of forming the glass insulating layer 2, and the electrically conducting paste is inserted, by screen printing, into a via hole which penetrates through the glass insulating layers 2 and 3, followed by the firing in the air according to a firing profile of a temperature of 800° to 950° C. for 10 minutes to form a lower part of a hole-filled conductor 9.

Next, a glass insulating layer 4 is formed through the same step as the above-mentioned step of forming the glass insulating layer 2, and the electrically conducting paste is poured by screen printing into a via hole in the glass insulating layer 4 that is communicating to the above-mentioned via hole, followed by the firing in the air according to a firing profile of a temperature of 800° to 950° C. for 10 minutes in order to form an upper part of the hole-filled conductor 9.

(Step of forming circuit on the surface layer)

Referring next to FIG. 10, the electrically conducting paste is printed on the surface of the glass insulating layer 4 and is fired according to a firing profile at a temperature of 850° to 950° C. for 10 minutes to form a wiring 7. Then, a protective glass paste is printed thereon and is fired in the air according to a firing profile of a peak temperature of 500° to 600° C. to form a protective glass layer 71.

The following steps are carried out in accordance with Example 1.

Figure 8:
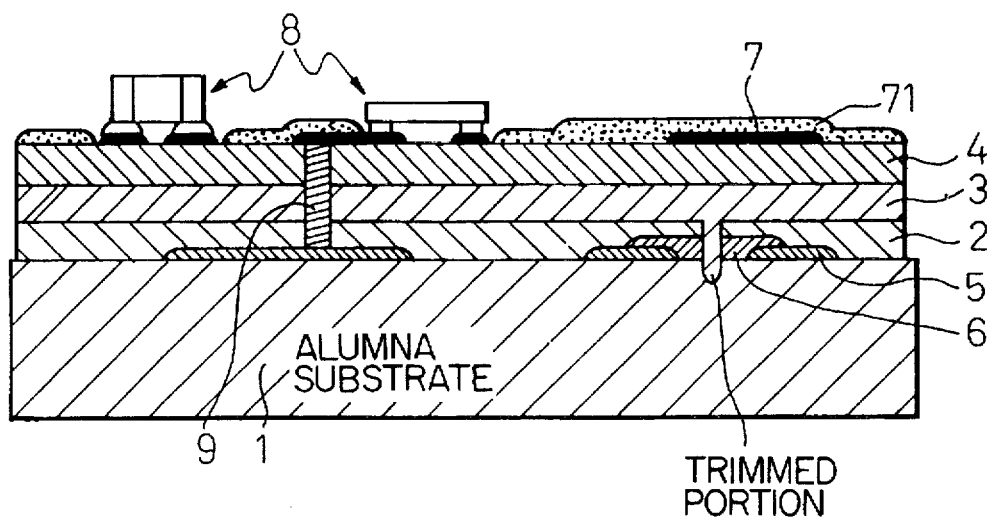
FIG. 8 is a sectional view which schematically illustrates the thick multi-layer substrate according to Examples 2 and 8.

FIG. 8 illustrates the structure of a multi-layer substrate having a thick-film resistor obtained according to this Example 2.

Figure 11:
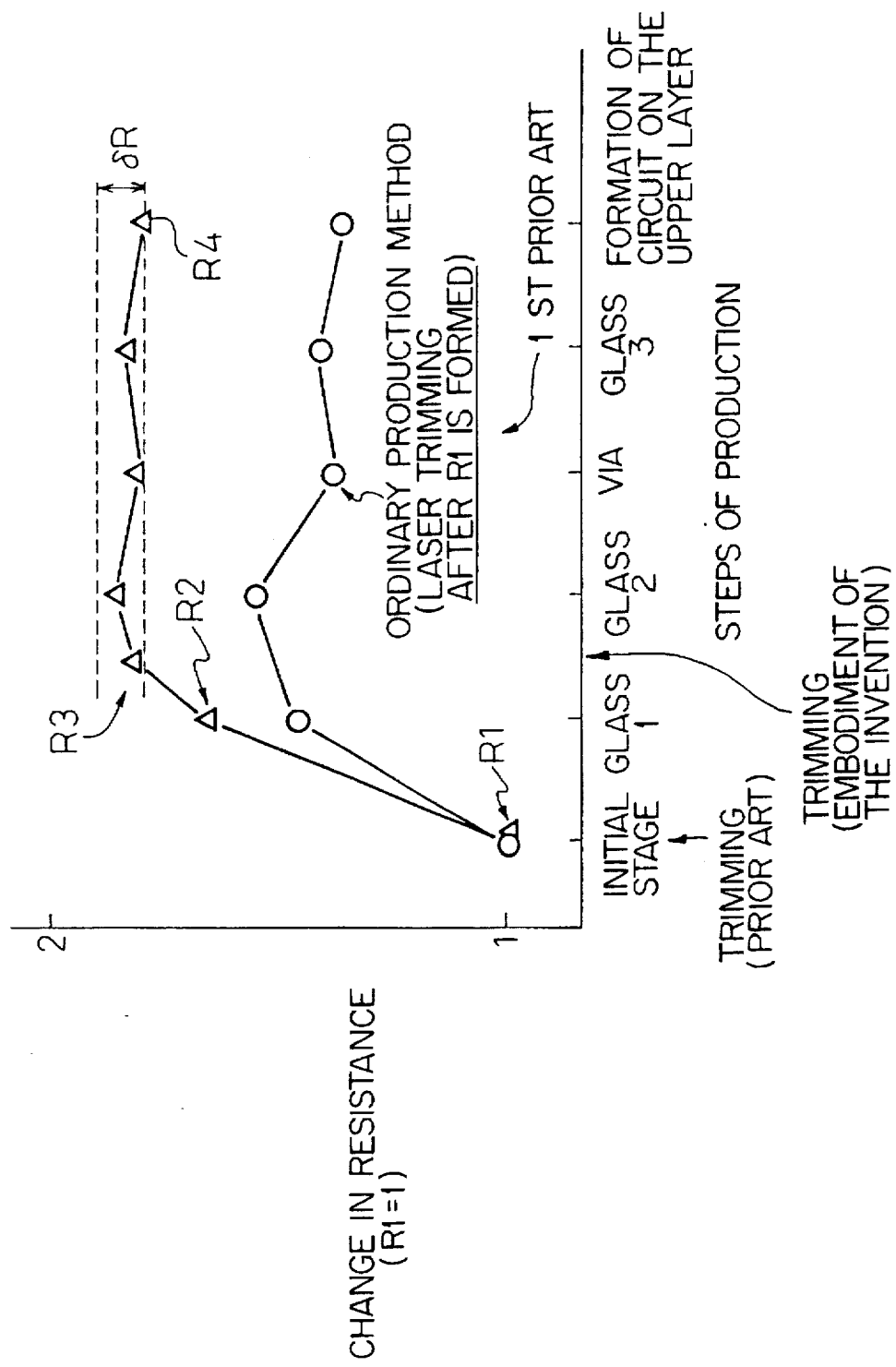
FIG. 11 is a diagram illustrating changes in the resistances of the thick-film resistors after each of the steps according to Example 2.

FIG. 11 shows the monitored results of changes in the resistance of the thick-film resistor 6 after each of the production steps. As will be obvious from FIG. 11, the resistance of the thick-film resistor 6 greatly changes when the lowermost glass insulating layer 2 is fired but changes very little through the subsequent firing steps. Therefore, a change δR in the resistance R can be greatly decreased.

Ten samples were prepared, and a difference δR between the maximum resistance R and the minimum resistance R after the laser trimming was about 5% with respect to R. According to the prior art in which the glass insulating layers 2 to 4 are formed after the laser trimming, on the other hand, the resistance changes so much after laser trimming that the substrate is not usable.

Figure 13:
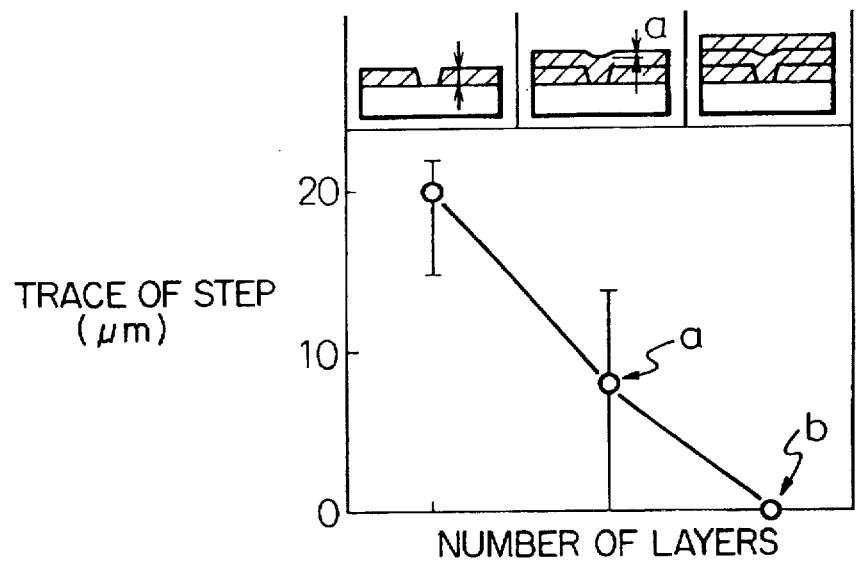
FIG. 13 is a diagram illustrating the state of repairing the laser-trimmed holes.

FIG. 13 illustrates the examined results of traces remaining on the surface of the glass insulating layer 4 caused by the laser trimming.

That is, FIG. 13 illustrates the state where a trace of laser trimming that is formed 20 μm deep and 100 μm in diameter in the glass insulating layer 2 is repaired by using glass insulating layers 3 and 4 which have a thickness of 20 μm, respectively. Twenty test samples were prepared, and a solid line in FIG. 13 represents variance thereof. It will be understood from FIG. 13 that the trace of laser trimming is almost all repaired by the overcoating of two glass insulating layers 3 and 4.

In the above-mentioned Example, furthermore, it is allowable to form a wiring on the surface of the glass insulating layer 3.

It is further allowable to print the glass insulating layers 3 and 4 two times consecutively and, then, fire the glass insulating layers 3 and 4 simultaneously.

Moreover, it is allowable to effect laser trimming through the glass insulating layers 2 and 3, and then form the glass insulating layer 4 on the whole surface of the thick-film resistor 6.

That is, there can be contrived a method of forming the insulating layers after the thick-film resistor is trimmed with a laser beam as a preferred example of the first embodiment. According to this embodiment, furthermore, it is desired to store a ratio of the resistance of the thick-film resistor immediately after the laser trimming to the resistance of the thick-film resistor of when the high-temperature step is finished, and to carry out the laser trimming based upon a resistance that is obtained by correcting in advance a desired resistance relying upon the above ratio.

By effecting the laser trimming after the thick-film resistor is fired but before forming the insulating layers, furthermore, it is possible to obtain resistance maintaining improved accuracy. Moreover, being covered with the insulating layers, the thick-film resistor becomes excellent in stability and permits wiring to be formed thereon.

EXAMPLE 3

According to this Example, the laser trimming is effected after the thick-film resistor 6 is formed to obtain a predetermined resistance accurately and, then, the glass insulating layers 2 to 4 are formed on the substrate 1 that includes the thick-film resistor 6. Since the thick-film resistor 6 has been fired at a high temperature, the resistance hardly changes even after the glass insulating layers 2 to 4 are fired at a low temperature as will be understood from FIG. 5.

Next, described below is the method of producing the thick multi-layer substrate according to the second embodiment of the present invention.

As described earlier, the basic technical constitution according to the second embodiment of the present invention is concerned with a method of producing thick multi-layer substrates comprising a step of forming a thick-film resistor by printing a thick-film resistor on a ceramic substrate followed by firing, a step of forming insulating layers by successively printing a plurality of insulating layers on the surface of said thick-film resistor and of said ceramic substrate followed by firing, a step of forming wiring by printing a wiring pattern onto said insulating layers followed by firing, and a step of trimming said thick-layer resistor with a laser beam, wherein said step of trimming with a laser beam is effected after the firing of part of said plurality of insulating layers on said thick-film resistor but before the firing of the remaining layers. It is desired that part of the layers is fired at a temperature higher than a temperature of firing the remaining layers and the wiring. Moreover, it is desired that the above-mentioned part of the layers is the lowermost insulating layer on the thick-film resistor. It is further desired that the lowermost layer among the plurality of insulating layers has a window through which the thick-film resistor is exposed partly or entirely.

A concrete example of the second embodiment of the present invention has already been mentioned in the above Example 2, and reference should be made thereto.

Mentioned below is another example of the second embodiment of the present invention.

EXAMPLE 4

Figure 14:
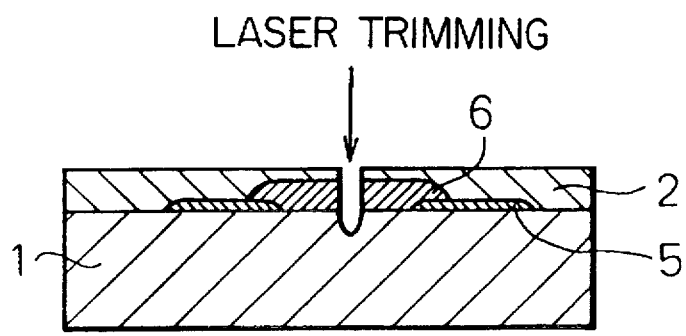
FIG. 14 is a sectional view which schematically illustrates a ceramic laminated substrate according to Example 4.

According to this Example, as shown in FIG. 14, the glass insulating layer 2 is printed on the thick-film resistor 5 maintaining a thickness of less than about 15 μm after firing. This makes it possible to reduce a change in the resistance and to reduce the laser output.

That is, as the thickness of the glass insulating layer 2 on the thick-film resistor 6 exceeds 10 μm, the laser energy is absorbed in increased amounts by the glass insulating layer 2 making it necessary to increase the laser output. As the thickness exceeds about 15 μm, the peripheral portions may be adversely affected.

EXAMPLE 5

Figure 15:
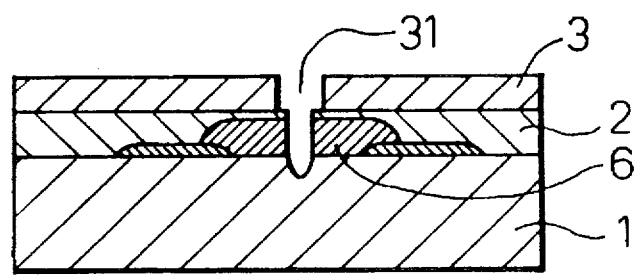
FIG. 15 is a sectional view which schematically illustrates a ceramic laminated substrate according to Example 5.

This Example will be described with reference to FIG. 15.

In this Example, a glass insulating layer 2 is printed and is fired and, then, a glass insulating layer 3, having a window 31 inserted therein, is printed thereon and fired. Laser trimming is then effected through the glass insulating layer 2 via the window 31. Thereafter, a glass insulating layer 4 (see FIG. 8) is printed thereon and is fired.

Since the glass insulating layer 3 is formed prior to effecting the laser trimming, the resistance varies less than that of Example 2. Moreover, since the window is formed in the intermediate glass insulating layer 3 only, a small step is formed in the surface of the glass insulating layer 4 by the window 31 and the thick-film resistor 6 is well protected. The laser output is the same as that of Example 2.

EXAMPLE 6

Figure 16:
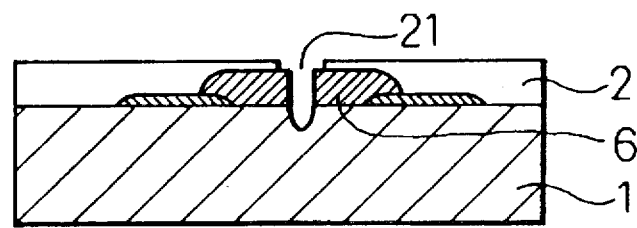
FIG. 16 is a sectional view which schematically illustrates a ceramic laminated substrate according to Example 6.

This Example will be described with reference to FIG. 16.

In this Example, a thick-film resistor 6 is printed and is fired and, then, a glass insulating layer 2 having a window 21 is printed thereon and is fired. The laser trimming is effected directly through the window 21. Thereafter, glass insulating layers 3 and 4 (see FIG. 8) are printed and fired.

Since the laser trimming is directly effected, it is possible to decrease the laser output. Moreover, since the window 21 is covered with the glass insulating layers 3 and 4, a trace of step caused by the window 21 decreases at the surface of the glass insulating layer 4 and the thick-film resistor 6 is well protected.

EXAMPLE 7

Figure 12:
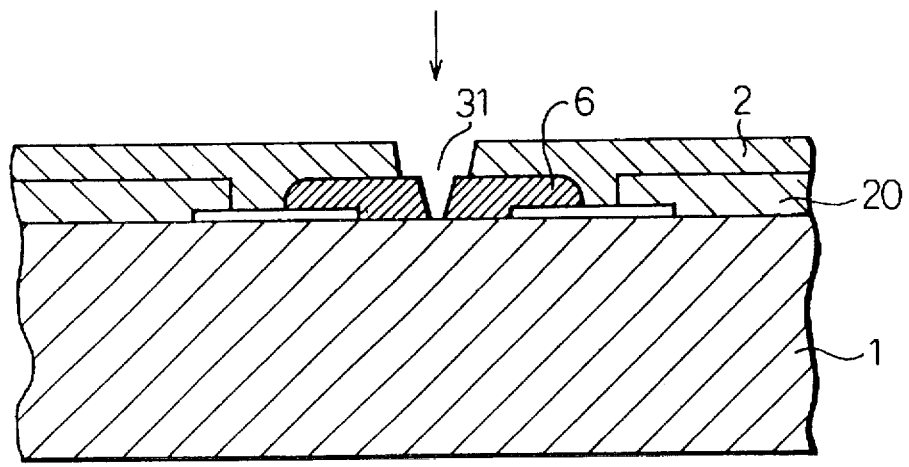
FIG. 12 is a diagram illustrating a trace of step on the surface of a glass insulating layer right on the laser-trimmed surface.

This Example will be described with reference to FIG. 12.

In this Example, a glass insulating layer 20 is printed and is fired prior to forming the glass insulating layer 2 in Example 2.

Here, the glass insulating layer 2 has a window 31 in the region of the thick-film resistor 6 that is to be trimmed with laser, and the glass insulating layer 20 has a window for accommodating the thick-film resistor 6.

Here, the thickness of the glass insulating layer 20 is nearly equal to the thickness of the thick-film resistor 6. The thick-film resistor 6 is directly trimmed with laser through the window 31 and, then, a glass insulating layer 4 (see FIG. 8) is printed and is fired.

This makes it possible to decrease the laser output, to cover the window 31 and to decrease the variance in the resistance.

EXAMPLE 8

This Example will be described with reference to FIG. 8.

In this Example, a glass insulating layer 2 is fired according to a profile of a temperature of 900° C. for 10 minutes as is done in Example 2, the thick-film resistor 6 is trimmed with laser through the glass insulating layer 2 or through a window formed on a region of the thick-film resistor 6 that is to be trimmed with laser and, then, glass insulating layers 3 and 4 are, respectively, fired on the whole surface of the thick-film resistor 6 according to a profile of a temperature of 850° C. for about 10 minutes.

In this case, since the glass insulating layer 2 is fired at a temperature which is higher than the temperature of Example 2 by about 50° C., the thick-film resistor 6 is little affected by the subsequent step at a high temperature and the resistance hardly changes.

Ten samples were prepared. The difference δR between a maximum resistance R and a minimum resistance R was 3% with respect to R, from which it was learned that a change in the resistance could be decreased after the trimming with laser.

That is, according to the conventional method as will be understood from FIG. 11, the resistance of the thick-film resistor is once established through the step of forming the first insulating layer 1 as designated at R2 but undergoes a great change in the subsequent steps. According to the present invention, on the other hand, the resistance of the thick-film resistor is established through the step of trimming as designated at R3, and varies to some extent within a predetermined allowable range δR in the subsequent steps contributing to further improving stability.

EXAMPLE 9

This Example will now be described.

In this Example, as in Example 2, an average change rate Rrm of a number of samples is calculated to find a changing rate Rr=R4/R3 of the resistance R3 of the thick-film resistor 6 after the laser trimming to the resistance R4 of the thick-film resistor 6 after the completion of the step of production, and the resistance R3 during the laser trimming is so determined as to obtain the desired resistance R4 by utilizing the average change rate Rrm during the laser trimming.

For instance, a desired resistance of the thick-film resistor 6 is denoted by Rx. Then, the thick-film resistor 6 is trimmed with laser presuming that the setpoint resistance R3 during the laser trimming is R3=Rx/Rrm. Then, even when the thermal hysteresis is given to the thick-film resistor 6 due to the firing of the glass insulating layers after the laser trimming, a change in the resistance of the thick-film resistor 6 caused by the thermal hysteresis can be minimized.

This is because, as shown in FIG. 11, the steps of firing the glass insulating layers and the wiring after the laser trimming are constant, and changes in the resistance caused by these steps essentially lie within a predetermined range.

EXAMPLE 10

A modified embodiment of Example 9 will be described below.

In this Example, average change rates Rrm of all thick-film resistors 6 on the circuit board are separately stored in the memory of a computer that compares resistances (compares measured resistance with desired resistance) during the laser trimming.

This is to compensate for slight changes in the average change rate Rrm caused by position on the circuit board and values of the thick-film resistor 6.

Then, even if the average change rate Rrm is slightly different due to position on the circuit board and values of the thick-film resistor 6, changes in the resistance of the thick-film resistor 6 due to thermal hysteresis can be minimized.

EXAMPLE 11

Described below is a modified embodiment of Example 10.

A plurality of (e.g., four) circuit boards as a lot are mounted on the same handling boat (made of, for example, alumina) and are subjected to each of the steps. In this Example, the average change rates Rrm of all thick-film resistors 6 that require laser trimming on the circuit boards on the boat are stored in the memory of a computer that compares resistances (compares a monitor resistance with desired resistances to be stored) during the laser trimming. Then, the thick-film resistors 6 that need laser trimming are separately subjected to laser trimming with the resistance R3 to have a desired resistance Rx/Rrm.

This is because the temperature of the circuit board changes slightly depending upon the positions where the circuit boards are placed on the ceramic boat and, hence, the thick-film resistors 6 that are formed on the same positions of the circuit boards exhibit slightly different resistances depending upon the temperature.

According to this Example, changes in the resistances can be further suppressed.

Further described below are modified embodiments of the first and second embodiments of the present invention.

EXAMPLE 12

In Example 9, a predetermined relationship is maintained between the thickness of the thick-film resistor 6 and the average change rate Rrm after the thermal hysteresis. If a graph which represents this relationship is stored, the average change rate Rrm can be found from this graph every time the thickness of the thick-film resistor 6 is changed. Therefore, the average change rate Rrm needs not be derived through experiment every time the thickness of the thick-film resistor 6 is changed.

EXAMPLE 13

In this Example, a barrier layer is formed on at least the thick-film resistor 6 after the thick-film resistor 6 is formed but before the glass insulating layer 2 is formed in order to prevent or decrease solid-phase diffusion between the thick-film resistor 6 and the glass insulating layer 4. The barrier layer may be formed before or after laser trimming. The barrier layer may be composed of any insulating material provided it decreases solid-phase diffusion relative to the thick-film resistor 6, decreases solid-phase diffusion between the thick-film resistor 6 and the glass insulating layer 4, and of which the phase is not changed by thermal hysteresis after the thick-film resistor 6 is formed. The barrier layer may be composed, for instance, of a silicon nitride film or an alumina film and may be formed by the CVD method, PVD method or print-firing method. When formed before the laser trimming, the barrier layer must have a thickness that can be cut by melting during laser trimming.

EXAMPLE 14

In this Example, a buffer layer is formed on at least the thick-film resistor 6 after the thick-film resistor 6 is formed but before the glass insulating layer 2 is formed, or the buffer layer is formed as the glass insulating layer 2, the buffer layer being softer than and having higher elasticity than the glass insulating layer formed thereon. The buffer layer may be formed either before or after laser trimming. The buffer layer may be composed of any insulating material provided it decreases solid-phase diffusion relative to the thick-film resistor 6, decreases solid-phase diffusion between the thick-film resistor 6 and the glass insulating layer 4, and of which the phase is not changed by thermal hysteresis after the thick-film resistor 6 is formed. The buffer layer may be formed by the CVD method, PVD method or print-firing method. When formed before the laser trimming, the buffer layer must have a thickness that can be cut by melting during laser trimming.

The buffer layer decreases the thermal stress that stems from a difference in the coefficient of thermal expansion of the thick-film resistor 6 and the glass insulating layer 2 or 3, contributing to decreasing a change in the resistance of the thick-film resistor 6 caused by the stress.

EXAMPLE 15

In this Example, a buffer layer is formed after the thick-film resistor 6 is formed but before the glass insulating layer 2 is formed, or the buffer layer is formed as the glass insulating layer 2, the buffer layer having a coefficient of thermal expansion between the coefficient of thermal expansion of the glass insulating layer just thereon and the coefficient of thermal expansion of the thick-film resistor 6. The buffer layer may be formed either before or after the laser trimming. The buffer layer may be composed of any insulating material provided it decreases solid-phase diffusion relative to the thick-film resistor 6, decreases solid-phase diffusion between the thick-film resistor 6 and the glass insulating layer 4, and of which the phase is not changed by thermal hysteresis after the thick-film resistor 6 is formed. The buffer layer may be formed by the CVD method, PVD method or print-firing method. When formed before the laser trimming, the buffer layer must have a thickness that can be cut by melting during laser trimming.

The buffer layer decreases the stress that stems from a difference in the coefficient of thermal expansion between the thick-film resistor 6 and the glass insulating layer 2 or 3, contributing to decreasing a change in the resistance of the thick-film resistor 6 caused by the stress.

EXAMPLE 16

In this Example, the main component of a glass contained in the thick-film resistor 6 is a crystalline glass. In this case, the internal glass is crystallized when the thick-film resistor 6 is fired and the melting point is high (it is desired that the melting point is higher than the noncrystalline glass by more than 100° C.). After the thick-film resistor 6 is fired, therefore, the melting point of the thick-film resistor 6 itself is high making it possible to decrease a change in the resistance that is caused by the mutual reaction between the thick-film resistor 6 and the insulating layer in the step of firing.

The same effect is obtained even when a crystalline glass is contained, as a main component, in the glass insulating layer 2.

We claim:

1. A method of producing thick multi-layer substrates comprising the steps of:

forming a thick-film resistor by printing a thick-film resistor on a ceramic substrate followed by firing, forming insulating layers by successively printing a plurality of insulating layers on the surfaces of said thick-film resistor and on said ceramic substrate followed by firing, and forming wiring by printing a wiring pattern onto said insulating layers followed by firing, wherein at least the firing of the thick film resistor and of the insulating layer in contact with the thick film resistor is done under the same atmosphere, and wherein said thick-film resistor is fired at a temperature higher than a temperature of firing said insulating layers that are in contact with said thick-film resistor.

2. A method of producing thick multi-layer substrates according to claim 1, wherein at least part of said plurality of insulating layers is fired at a temperature different from the temperature of firing other insulating layers.

3. A method of producing thick multi-layer substrates according to claim 2, wherein the insulating layer close to said thick-film resistor is fired at a temperature higher than the temperature of firing the insulating layers that are located more remote from said thick-film resistor than said insulating layer that is located less remote from said thick-film resistor.

4. A method of producing thick multi-layer substrates according to claim 1, wherein said thick-film resistor is fired at a temperature higher than the temperature of firing said insulating layers and said wiring pattern that are fired thereafter.

5. A method of producing thick multi-layer substrates according to claim 1, wherein crystalline glass is contained in either the thick-film resistor or the insulating layers.

6. A method of producing thick multi-layer substrates according to claim 1, further comprising a step of adjusting the resistance of the thick-film resistor prior to the formation of the insulating layer in contact with the thick-film resistor.

7. A method of producing thick multi-layer substrates according to claim 6, further comprising a step of determining a ratio between a resistance value of a thick-film resistor just after firing the resistor and a resistance value of the thick-film resistor just after a completion of the resistance adjusting step, wherein said adjustment step includes adjusting the resistance value of the thick-film resistor so that the adjusted value corresponds to a target value of the resistance as corrected by the determined ratio.

8. A method of producing thick multi-layer substrates according to claim 6, wherein said processing for adjusting the resistance is a step of laser trimming.

9. A method of producing thick multi-layer substrates according to claim 7, wherein said processing for adjusting the resistance is a step of laser trimming.

10. A method of producing thick multi-layer substrates comprising the steps of:

forming a thick-film resistor by printing a thick-film resistor on a ceramic substrate followed by firing, forming insulating layers by successively printing a plurality of insulating layers on the surfaces of said thick-film resistor and on said ceramic substrate followed by firing, at least the firing of the thick film resistor and of the insulating layer in contact with the thick film resistor being done under the same atmosphere, forming wiring by printing a wiring pattern onto said insulating layers followed by firing, and trimming said thick-layer resistor with a laser beam, wherein said step of trimming with a laser beam is effected after the firing of part of said plurality of insulating layers on said thick-film resistor but before the formation and firing of the remaining layers, and an area to which said trimming operation was carried out, is covered with an insulating layer formed by a separate process performed after said trimming operation has been completed.

11. A method of producing thick multi-layer substrates according to claim 10, wherein said part of the layers is fired at a temperature higher than a temperature of firing said remaining layers and said wiring.

12. A method of producing thick multi-layer substrates according to claim 10, wherein said part of the layers is the lowermost insulating layer on said thick-film resistor.

13. A method of producing thick multi-layer substrates according to claim 10, wherein the lowermost layer among said plurality of insulating layers has a window through which said thick-film resistor is exposed partly or entirely.

14. A method of producing thick multi-layer substrates according to claim 10, wherein crystalline glass is contained in either the thick-film resistor or the insulating layers.

15. A method of producing thick multi-layer substrates according to claim 10, further comprising a step of forming a thick-film circuit on said insulating layer formed over said area to which said trimming operation was carried out.

16. A method of producing thick multilayer substrates comprising the steps of:

forming a thick-film resistor by printing a thick-film resistor on a ceramic substrate followed by firing, forming insulating layers by successively printing a plurality of insulating layers on the surfaces of said thick-film resistor and on said ceramic substrate followed by firing, and forming wiring by printing a wiring pattern onto said insulating layers followed by firing, wherein at least the firing of the thick film resistor and of the insulating layer in contact with the thick film resistor is done under the same atmosphere, and wherein said thick-film resistor is fired at a temperature which is higher by 20° to 100° C. than the temperature of firing said insulating layers that are in contact with said thick-film resistor.

17. A method of producing thick multi-layer substrates comprising the steps of:

forming a thick-film resistor by printing a thick-film resistor on a ceramic substrate followed by firing, forming insulating layers by successively printing a plurality of insulating layers on the surfaces of said thick-film resistor and on said ceramic substrate followed by firing, forming wiring by printing a wiring pattern onto said insulating layers followed by firing, and trimming said thick-layer resistor with a laser beam, wherein said step of trimming with a laser beam is effected after the firing of part of said plurality of insulating layers on said thick-film resistor but before the formation and firing of the remaining layers, and an area to which said trimming operation was carried out, is covered with an insulating layer formed by a separate process performed after said trimming operation has been completed.

18. A method of producing thick multi-layer substrates according to claim 17, wherein said part of the layers is fired at a temperature higher than a temperature of firing said remaining layers and said wiring.

19. A method of producing thick multi-layer substrates according to claim 17, wherein said part of the layers is the lowermost insulating layer on said thick-film resistor.

20. A method of producing thick multi-layer substrates according to claim 17, wherein the lowermost layer among said plurality of insulating layers has a window through which said thick-film resistor is exposed partly or entirely.

21. A method of producing thick multi-layer substrates according to claim 17, wherein crystalline glass is contained in either the thick-film resistor or the insulating layers.

22. A method of producing thick multi-layer substrates according to claim 17, further comprising a step of forming a thick-film circuit on said insulating layer formed over said area to which said trimming operation was carried out.

* * * * *